United States Patent
Daubenspeck et al.

(10) Patent No.: US 8,629,557 B2
(45) Date of Patent: Jan. 14, 2014

(54) STRUCTURES AND METHODS FOR DETECTING SOLDER WETTING OF PEDESTAL SIDEWALLS

(75) Inventors: Timothy H. Daubenspeck, Colchester, VT (US); Jeffrey P. Gambino, Westford, VT (US); Christopher D. Muzzy, Burlington, VT (US); Wolfgang Sauter, Hinesburg, VT (US); Timothy D. Sullivan, Franklin Lakes, NJ (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 13/414,877

(22) Filed: Mar. 8, 2012

(65) Prior Publication Data

US 2013/0234315 A1 Sep. 12, 2013

(51) Int. Cl.
*H01L 23/48* (2006.01)
*H01L 21/00* (2006.01)
*B23K 31/00* (2006.01)

(52) U.S. Cl.
USPC ........... 257/738; 257/779; 257/780; 257/786; 257/E23.02; 257/E23.021; 438/108; 438/613; 228/180.1; 228/180.22

(58) Field of Classification Search
None
See application file for complete search history.

(56) References Cited

U.S. PATENT DOCUMENTS

| | | | |
|---|---|---|---|
| 6,889,430 B2 | 5/2005 | Jiang et al. | |
| 7,208,348 B2 | 4/2007 | Geng et al. | |
| 7,663,201 B2 * | 2/2010 | Yamada | 257/459 |
| 2006/0278984 A1 * | 12/2006 | Yamada | 257/737 |
| 2010/0187688 A1 * | 7/2010 | Hochstenbach | 257/738 |

FOREIGN PATENT DOCUMENTS

| | | |
|---|---|---|
| JP | 11153562 | 6/1999 |
| JP | 2000146801 | 5/2000 |
| JP | 2002312766 | 10/2002 |
| JP | 2002333414 | 11/2002 |
| JP | 2003224354 | 8/2003 |
| JP | 2004151010 | 5/2004 |
| JP | 2009194205 | 8/2009 |

OTHER PUBLICATIONS

Yu et al., Three Dimensional Interconnects with High Aspect Ratio TSVs and Fine Pitch Solder Microbumps, 2009 Electronic Components and Technology Conference, pp. 350-354.

* cited by examiner

*Primary Examiner* — Alonzo Chambliss
(74) *Attorney, Agent, or Firm* — Schmeiser, Olsen & Watts; David A. Cain

(57) ABSTRACT

Structures and methods for detecting solder wetting of pedestal sidewalls. The structure includes a semiconductor wafer having an array of integrated circuit chips, each of the integrated circuit chips having an array of chip pedestals having respective chip solder columns on top of the chip pedestals, the pedestals spaced apart a first distance in a first direction and a spaced apart second distance in second direction perpendicular to the first direction; and at least one monitor structure disposed in different regions of the wafer from the integrated circuit chips, the monitor structure comprising at least a first pedestal and a first solder column on a top surface of the first pedestal and a second pedestal and a second solder column on a top surface of the second pedestal, the first and the second pedestals spaced apart a third distance, the third distance less than the first and the second distances.

21 Claims, 8 Drawing Sheets

*FIG. 6B*  *FIG. 6A*

STRUCTURES AND METHODS FOR DETECTING SOLDER WETTING OF PEDESTAL SIDEWALLS

FIELD OF THE INVENTION

The present invention relates to the field of integrated circuits; more specifically, it relates to a structure and the method for detecting solder wetting of the pedestal sidewalls in solder ball integrated circuit chips.

BACKGROUND

Solder bumps on integrated circuit chips are used to electrically and mechanically join the integrated circuit chip to a module. In the newer technologies, the solder bumps are formed on a raised copper pedestal formed on the chip pad rather than directly on the chip pad. When the solder bumps are formed on pedestals, solder can form on the sidewalls of the pedestal in a process called sidewall wetting. Sidewall wetting can change the stress conditions under the solder bump after joining to the module causing damage in the underlying region of the integrated circuit chip as well as causing coplanarity issues within the solder bump array. Accordingly, there exists a need in the art for a method of detecting sidewall wetting.

SUMMARY

A first aspect of the present invention is a structure, comprising: a semiconductor wafer having an array of integrated circuit chips, each integrated circuit chip of the array of integrated circuit chips having an array of chip pedestals having respective chip solder columns on top surfaces of the chip pedestals, the pedestals spaced apart a first distance in a first direction and a spaced apart second distance in second direction perpendicular to the first direction; and at least one monitor structure disposed in different regions of the semiconductor wafer from the integrated circuit chips, the monitor structure comprising at least a first pedestal and a first solder column on a top surface of the first pedestal and a second pedestal and a second solder column on a top surface of the second pedestal, the first and the second pedestals spaced apart a third distance, the third distance less than the first distance and the second distance.

A second aspect of the present invention is a method, comprising: forming a semiconductor wafer having an array of integrated circuit chips, each integrated circuit chip of the array of integrated circuit chips having an array of chip pedestals having respective chip solder columns on top surfaces of the chip pedestals, the pedestals spaced apart a first distance in a first direction and a spaced apart second distance in second direction perpendicular to the first direction; and at least one monitor structure disposed in different regions of the semiconductor wafer from the integrated circuit chips, the monitor structure comprising at least a first pedestal and a first solder column on a top surface of the first pedestal and a second pedestal and a second solder column on a top surface of the second pedestal, the first and the second pedestals spaced apart a third distance, the third distance less than the first distance and the second distance.

A third aspect of the present invention is a structure comprising: at least two chip pedestals having top surfaces and respective solder columns on top surfaces thereof, the chip pedestals spaced a first distance apart; and a first pedestal having a first circular body region and a second pedestal having a circular body region and an integral comb structure extending from one side of the second circular body region, the comb comprised of at least two parallel fingers extending toward the first pedestal and terminating a second distance from the first pedestal, the first distance greater than the second distance.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

The solder bump structures of the present invention are formed on raised pedestals on the top surfaces of integrated circuit chips by plating the solder onto the pedestal which forms a cylinder of solder on the pedestal. After a first reflow process (see infra) roughly spherical solder bumps are formed on the top surface of the pedestal. However, during this process, some solder can be drawn down the sidewalls of the pedestal in a process called sidewall wetting. The monitor structures of the present invention are either optically inspected or electrically probed after the first reflow and after the solder bumps have cooled to room temperature. A second reflow process (see infra) is used to join the integrated circuit chip to the module. It has been found that the dielectric in underlying wiring layers can crack after cool down from the second reflow process thereby breaking the wires after the integrated circuited is joined to the module. This is particularly true when low-K (dielectric constant) dielectrics (e.g., having a dielectric constant of between about 2.4 and about 3) and an ultra-low-K (ULK) (e.g., having a dielectric constant of about 2.4 or less) are used as the interlevel dielectric of certain of the wiring levels. Solder bump technology is also known as C4 technology where C4 stands for controlled-chip-collapse-connection.

The embodiments of the present invention allow for monitoring for sidewall wetting at wafer level by using monitor structures that mimic normal pedestals/solder bumps but are designed to be predisposed for pedestal sidewall wetting.

The term normal solder bump is defined as a solder bump that does not wet the sidewalls of the pedestal which it is formed on. The term defective solder bump is defined as a solder bump that wets the sidewalls of the pedestal which it is formed on. The term functional pedestal is defined as a pedestal required for proper functioning of the integrated circuit chip and provides either input/output (I/O) or power or ground to the integrated circuit chip. The term functional solder bump is defined as a solder bump formed on a functional pedestal. A functional solder bump may also be a normal solder bump or a defective solder bump. The term facilitate is used in the sense of a condition that allows a process to take place.

Figure 1A:
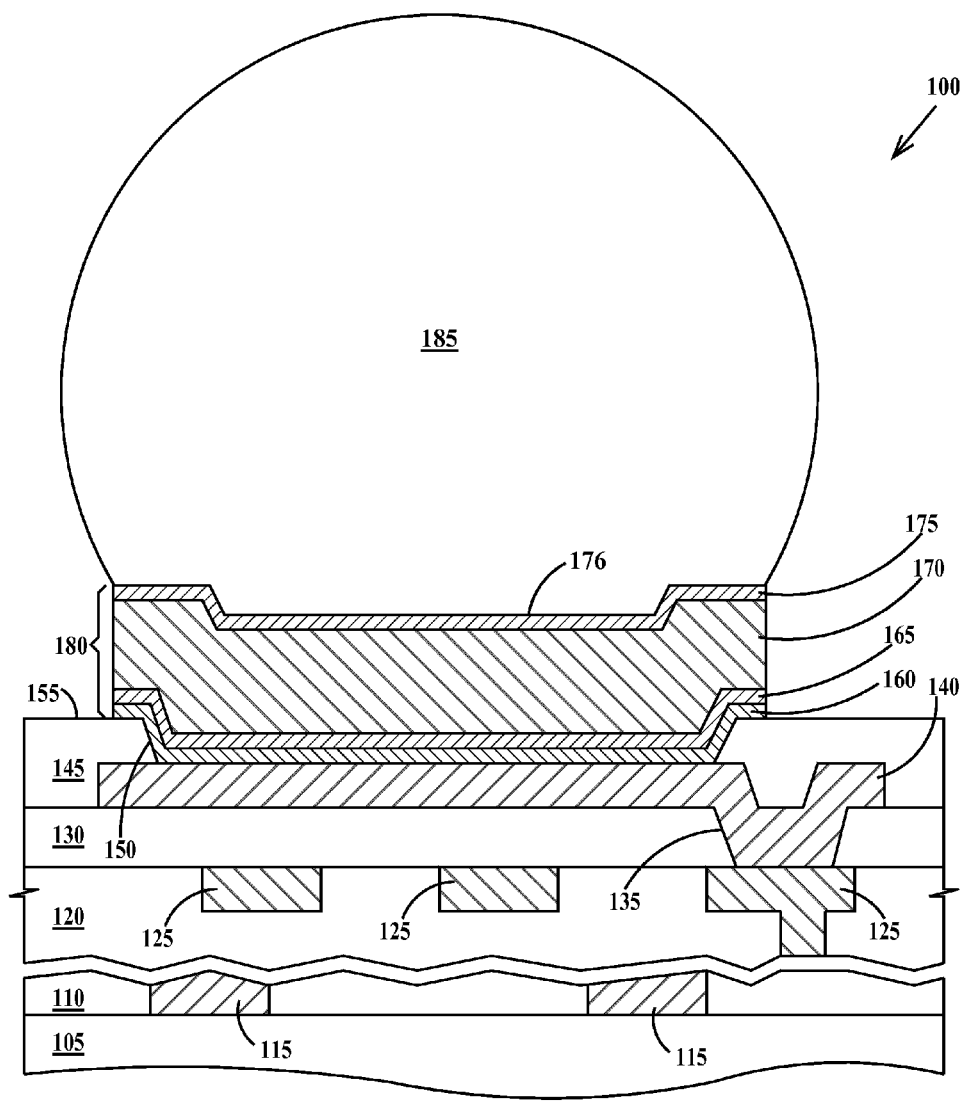
FIG. 1A is a cross-sectional view of an exemplary normal solder bump on an integrated circuit.

FIG. 1A is a cross-sectional view of an exemplary normal solder bump on an integrated circuit. In FIG. 1A, an integrated circuit 100 includes a semiconductor (e.g., silicon) substrate 105 on which has been formed multiple interlevel dielectric (ILD) layers from a first ILD layer 110 (closest to substrate 100) including damascene wires 115 to a last ILD layer 120 (farthest from substrate 105) including damascene wires 125. Damascene wires are wires formed by forming a trench in an ILD layer and filling the trench with a metal (i.e. copper (Cu)) so the top surface of the wire is coplanar with the top surface of the ILD layer. In one example, there may be between three and ten ILD. In one example, there may be more than ten wiring levels. In one example, at least one of the ILD layers between ILD layer 110 and ILD layer 120 comprises a low-K or ULK material.

Formed on the top surface of last ILD layer 120 and damascene wires 125 is an inorganic passivation layer 130 which, in one example, comprises a layer of silicon nitride on a layer of silicon oxide. A via opening 135 is formed in passivation layer 130 over a wire 125. A chip pad 140 is formed on the top surface of inorganic passivation layer 130 and in via 135. In one example, chip pad 140 comprises aluminum. Formed on a top surface of inorganic passivation layer and on wire 140 is a dielectric organic passivation layer 145 which, in one example, is polyimide. A via opening 150 is formed in organic passivation layer 145 over chip pad 140.

Formed on a top surface 160 of organic passivation layer 145 and in via opening 150 is a first barrier layer 160, which in one example comprises sputtered titanium tungsten (TiW). First barrier layer 160 is a barrier to Cu diffusion and also an adhesion promoting layer. Formed on and coextensive with first barrier layer 160 is a seed layer 165 which, in one example, comprises sputtered Cu. Formed on and coextensive with seed layer 160 is a core layer 170 which, in one example, comprises electro-plated Cu. Formed on and coextensive with core layer 160 is a second barrier layer 175 which, in one example, comprises electro-plated nickel (Ni). Second barrier layer 175 is a barrier to tin (Sn), silver (Ag) and Cu. Thereby a pedestal 180 has been formed comprising first barrier layer 160, seed layer 165, core layer 170 and second barrier layer 175. The number of layers in pedestal 180 and the materials of those layers (except core layer 170 which is copper) may vary.

Formed on a top surface 176 of pedestal 180 is a solder bump 185. Solder bump 185 is formed by electroplating Sn, Sn/Ag or Sn/Ag/Cu on the second barrier layer 176 to form solder columns and then performing a first reflow process (i.e., heating the cylinder of solder formed by the electroplating to the melting point or just above the melting point of the solder in an inert or reducing atmosphere (e.g., hydrogen, nitrogen or a mixture thereof)) to form solder bump 185 with a semi-spherical shape. In one example, solder bump 185 is at least 95% by weight Sn.

An exemplary process for forming the structure above chip pad 140 and organic passivation layer 145 would be: (1) sputter deposit the first barrier layer on the wafer, (2) sputter deposit the seed layer on the first barrier layer, (3) form a photo-sensitive layer on the seed layer, (4) form openings in the photosensitive layer over the chip pads, (5) electroplate the pedestal core in the openings, (6) electroplate the second barrier layer in the openings, (7) electroplate solder columns in the openings, (8) remove the photosensitive layer, (9) remove the first barrier layer and the seed layer from between the plated layers, and (10) perform the first reflow process (described supra) to convert the solder columns to solder bumps.

Figure 1B:
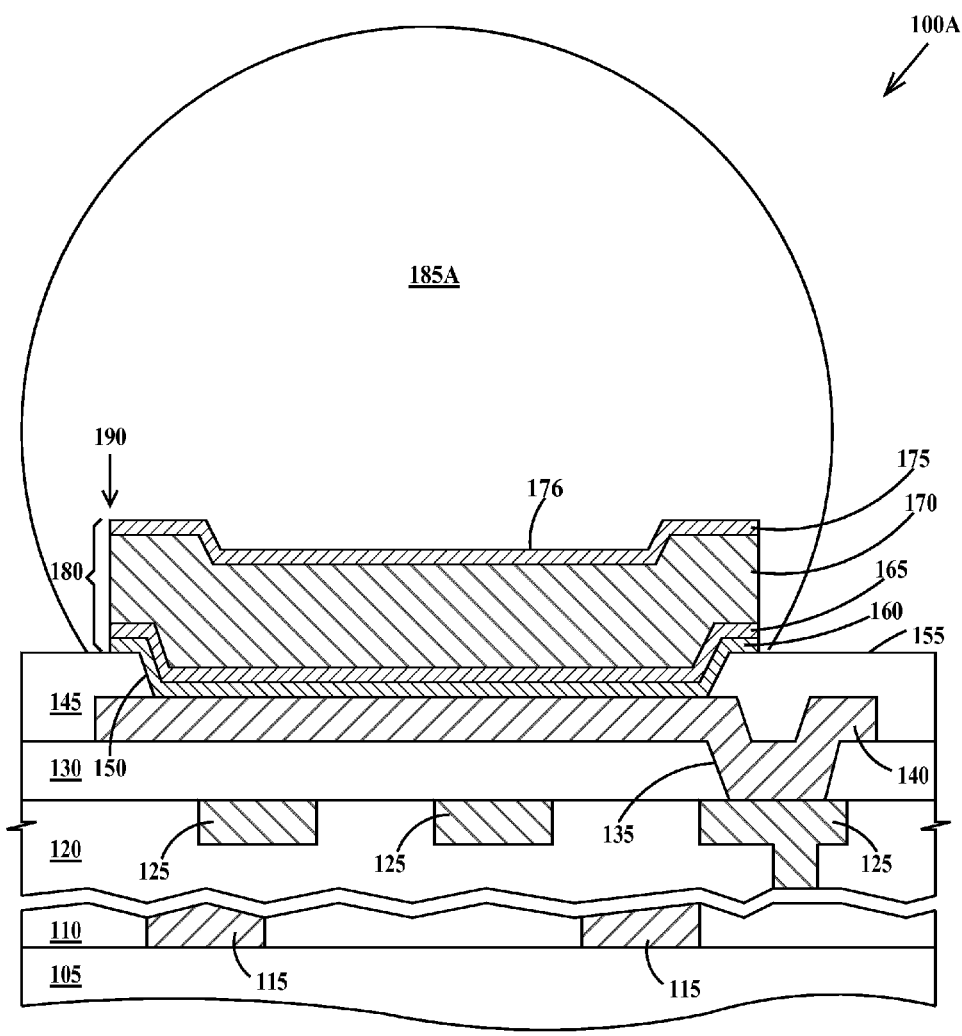
FIG. 1B is a cross-sectional view of an exemplary defective solder bump where the pedestal sidewall is wetted by solder from the solder bump on an integrated circuit.

FIG. 1B is a cross-sectional view of an exemplary defective solder bump where the pedestal sidewall is wetted by solder from the solder bump on an integrated circuit. In FIG. 1B, an integrated circuit 100A is similar to integrated circuit 100 of FIG. 1A except solder bump 185A replaces solder bump 185 of FIG. 1A. Solder bump 185A is formed not only on the top surface 176 of pedestal 180 but also on the sidewall 190 of pedestal 180. Solder bump 185A also contacts top surface 155 of organic passivation layer 145.

Figure 2:
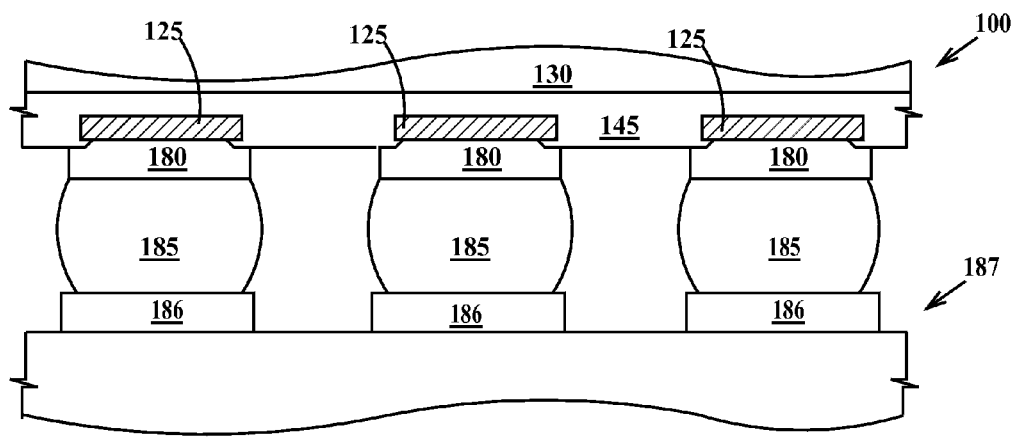
FIG. 2 illustrates chip join of an integrated circuit chip to a module.

FIG. 2 illustrates chip join of an integrated circuit chip to a module. Solder bumps are arranged on the top surface of integrated circuit chips in arrays of rows and columns (see FIG. 9). In FIG. 2, only a portion of a single row of solder bumps is illustrated. In FIG. 2, integrated circuit chip 100 is joined to module pads 186 (in one example, comprised of copper) of a module 187 by solder bumps 185 which have a different shape after the second reflow process (i.e., heating the solder bumps formed by the first reflow process to the melting point or just above the melting point of the solder in an inert atmosphere (e.g., hydrogen, nitrogen or a mixture thereof)) because of the weight of the module has caused the height of the solder bump to "collapse."

Figure 3A:
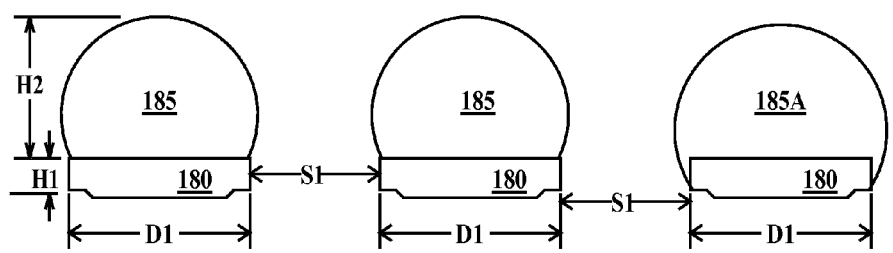
FIG. 3A is a side view through line 3A-3A of the top view of FIG. 3B illustrating the difficulty of detecting solder wetting on the sidewalls of pedestals.
Figure 3B:
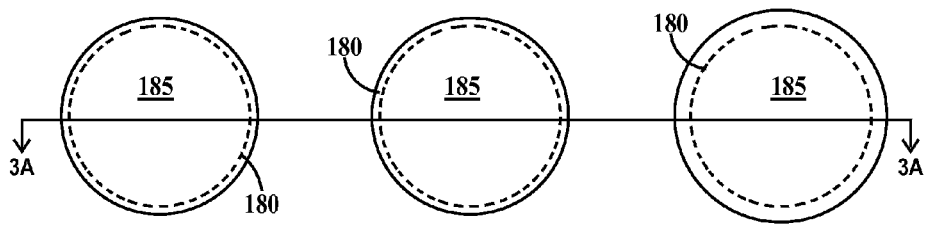

FIG. 3A is a side view through line 3A-3A of the top view of FIG. 3B illustrating the difficulty of detecting solder wetting on the sidewalls of pedestals at wafer level. In FIGS. 3A and 3B, only three functional solder bumps of a single row are illustrated. In FIG. 3A, two solder bumps 185 are formed on the leftmost pedestals 180 and a solder bump 185A is formed on the rightmost pedestal 180. Solder bump 185A has wetted the sidewalls of the rightmost pedestal 180. Pedestals 180 have a diameter D1 and are spaced apart a distance S1. In one example, D1 is between about 90 microns and about 120 microns and S1 is between about 60 microns and about 120 microns. Pedestals 180 have a height H1 and solder bumps have a height H2. In one example, H1 is between about 8 microns and about 12 microns. In one example, H2 is between about 60 microns and about 90 microns.

Turning to FIG. 3B, from a top view, the only difference between pedestals where the solder has wetted the pedestal and pedestals where the solder has not wetted the sidewalls of the pedestal is a slightly larger diameter of the solder bump 185A (greatly exaggerated in FIG. 3B) versus solder bumps 180 which could not be detected with any degree of certainty with normal incidence optical microscopy. Tilt-angle optical microscopy at chip level could detect pedestal sidewall wetting but requires dicing the wafer first. Both these methods would be prohibitively expensive and time-consuming and cannot be used at wafer level.

Figure 4A:
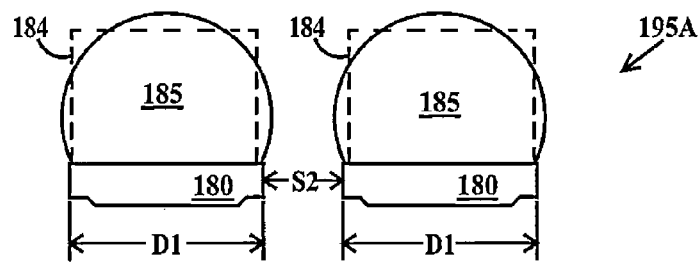
FIG. 4A is a side view through line 4A-4A of the top view of FIG. 4B illustrating a structure for detecting solder wetting of the pedestal sidewall according to an embodiment of the present invention without solder wetting on the pedestal sidewalls.
Figure 4B:
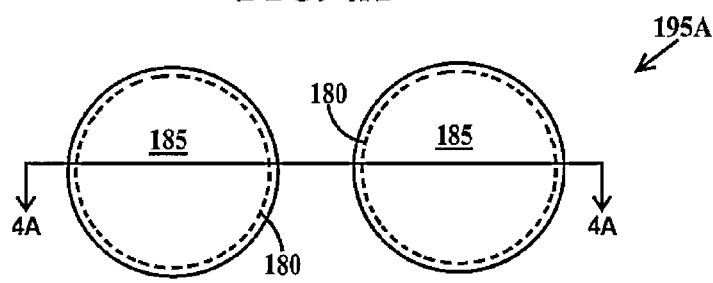

FIG. 4A is a side view through line 4A-4A of the top view of FIG. 4B illustrating a structure for detecting solder wetting of the pedestal sidewall according to an embodiment of the present invention without solder wetting on the pedestal sidewalls. In FIG. 4A, a monitor structure 195A includes a pair of pedestals 180 separated by a distance S2 and solder columns 184 formed on the pedestals (dashed lines). The perimeters of solder columns 184 and pedestals 180 are coextensive. After the first reflow process solder columns 184 are converted to solder bumps 185. S2 is less than S1 of FIG. 3A (i.e., in the monitor structure the pedestals are placed closer together than in functional pedestals). In FIG. 4B, after the first reflow that converts solder columns 184 to solder bumps 185 two distinct and normal solder bumps 185 are visible. In one example, S2 is about 0.1 to about 0.2 times D1. For example, if D1 is 100 microns, S2 is between about 10 microns and about 20 microns.

Figure 5A:
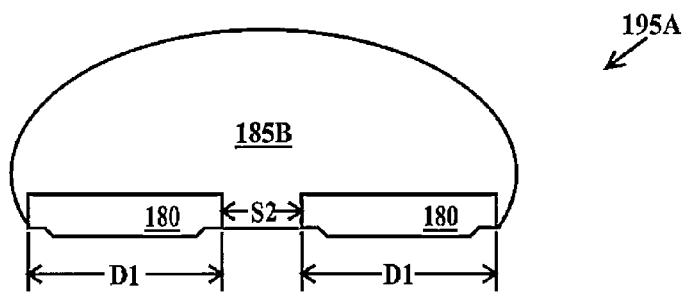
FIG. 5A is a side view through line 5A-5A of the top view of FIG. 5B illustrating the structure of FIGS. 4A and 4B with solder wetting on the pedestal sidewalls.
Figure 5B:
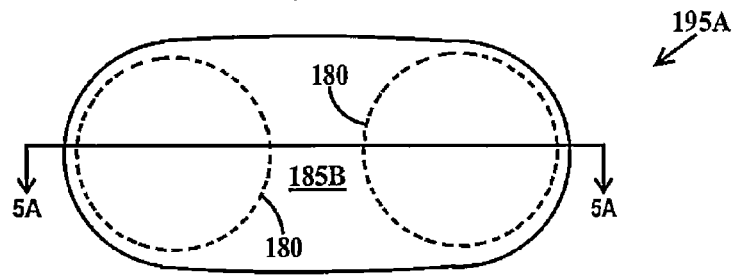

FIG. 5A is a side view through line 5A-5A of the top view of FIG. 5B illustrating the structure of FIGS. 4A and 4B with solder wetting on the pedestal sidewalls. In FIGS. 5A and 5B, solder wetting of the pedestal sidewalls has occurred after the first reflow and because of the sidewall wetting and the smaller spacing S2, a single oval shaped solder bump 185B is formed. In one example, the value of S2 is selected to facilitate solder columns 184 of FIG. 4A merging into a single solder bump if the solder wets the sidewalls of pedestals 180, and to form two solder bumps if the solder does not wet the sidewalls of the pedestals during the first reflow. Solder bump 185B is easily distinguished from the pair of solder bumps 185 of FIG. 4B when viewed from above.

Figure 8:
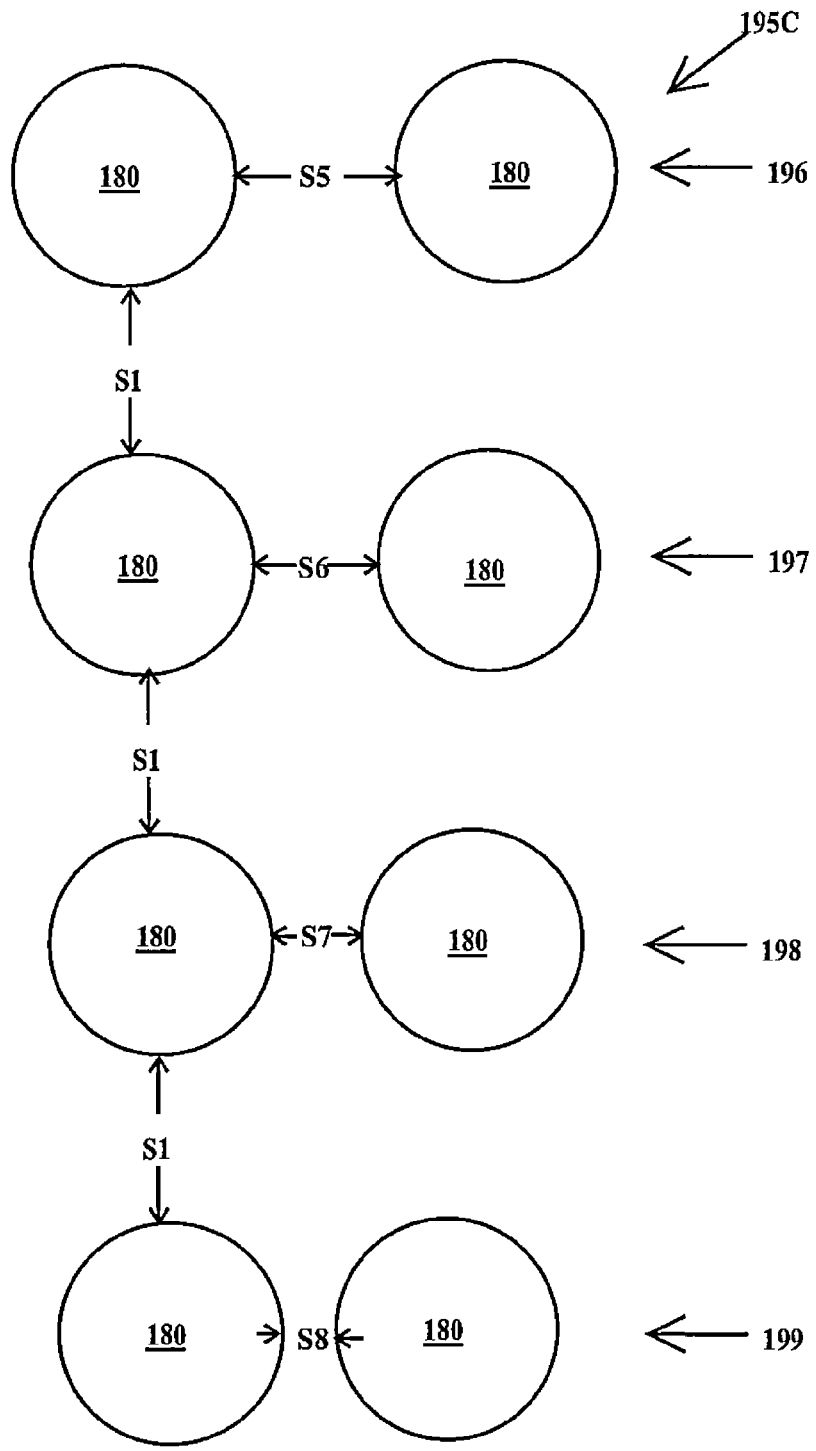
FIG. 8 is a top view of illustrating a structure for detecting solder wetting of the pedestal sidewall according to an embodiment of the present invention.

The value selected for S2 is critical to the operation of the invention. If S2 is too large, two solder bumps instead of one will form even if there is sidewall wetting. If S2 is too small, such that the surfaces of the solder bumps touch, a single solder bump will form even if there is not sidewall wetting. Monitor structure 195C of FIG. 8, is useful for selecting the value for S2 as well as being a useful monitor structure on its own.

In FIGS. 4A, 4B, 5A and 5B, pedestals 180 are the same as pedestal 180 of FIG. 1. In FIGS. 4A, 4B, 5A and 5B, no underlying chip structures are illustrated. If the monitor structure 195A is placed in the kerf (see FIG. 9A and discussion infra), at least all the dielectric layers present in FIG. 1 would be present in FIGS. 4A, 4B, 5A and 5B. Optionally at least chip pad similar to chip pad 140 of FIG. 1 and organic passivation layer 145 would be present. If monitor structure 195A is placed in the empty regions of the wafer (see FIG. 9A and discussion infra), not all the layers present in FIG. 1 would be present in FIGS. 4A, 4B, 5A and 5B. For example, only certain of the layers would be present. Again, optionally at least chip pad similar to chip pad 140 of FIG. 1 and organic passivation layer 145 would be present.

Solder columns 184 are part of the monitor structure 195A but solder bumps 185 and 185B are part of the monitor structure 195A after the first reflow only in the same sense that the fusible link of a fuse is part of the fuse after the fuse blows.

After the first reflow, monitor structure 195A is inspected at wafer level. If two distinct solder bumps are detected as in FIG. 4B, then the wafer is passed. If a single solder bump is detected as in FIG. 5B, then the wafer is failed.

FIG. 6A is a top view illustrating a pedestal for use in a structure for detecting solder wetting of the pedestal sidewalls according to an embodiment of the present invention. In FIG. 6A, a pedestal 180A includes an integral comb structure 181 extending from one side of a circular body region 182. Comb 181 is comprised of individual parallel fingers 183. In FIG. 6A there four fingers 183, but there may be as few as two and more than four.

Figure 6C:
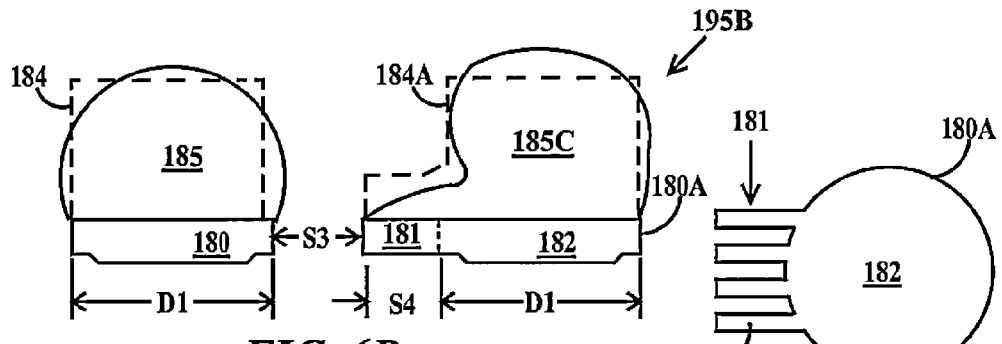
FIG. 6A is a top view illustrating a pedestal for use in a structure for detecting solder wetting of the pedestal sidewalls according to an embodiment of the present invention.
FIG. 6B is a side view through line 6B-6B of the top view of FIG. 6C illustrating a structure for detecting solder wetting of the pedestal sidewall according to an embodiment of the present invention without solder wetting on the pedestal sidewalls.
Figure 6C:
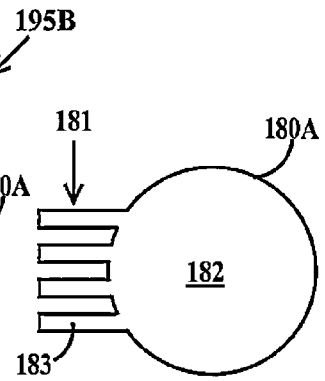
Figure 6C:
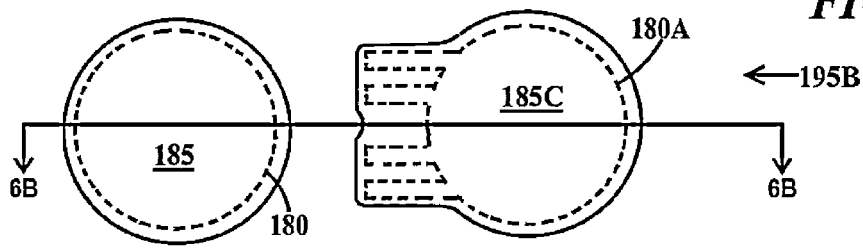

FIG. 6B is a side view through line 6B-6B of the top view of FIG. 6C illustrating a structure for detecting solder wetting of the pedestal sidewall according to an embodiment of the present invention without solder wetting on the pedestal sidewalls. In FIG. 6B a monitor structure 195B includes a pedestal 180 and a pedestal 180A separated by a distance S3 and solder columns 184 and 184A on the pedestals (dashed lines). The perimeters of solder column 184 and pedestal 180 are coextensive and the perimeters of pedestal 180A and solder column 184A are coextensive. After the first reflow process solder column 184 is converted to solder bump 185 and solder column 184A is converted to solder bump 185C. S3 is less than S1 of FIG. 3A (i.e., in the monitor structure the pedestals are placed closer together than in functional pedestals). In one example, the value of S3 is selected to facilitate solder columns 184 of FIG. 4A merging into a single solder bump if the solder wets the sidewalls of pedestals 180, and to form two solder bumps if the solder does not wet the sidewalls of the pedestals during the first reflow. Comb 181 projects a distance S4 from body region 182. In FIG. 6C, two distinct solder bumps are visible, a first solder bump 185 and a second solder bump 185C. In one example, S3 is about 0.1 to about 0.2 times D1. For example, if D1 is 100 microns, S3 is between about 10 microns and about 20 microns. In one example, S4 is about 0.3 to about 0.5 times D1. For example, if D1 is 100 microns, S3 is between about 30 microns and about 50 microns.

Figure 7A:
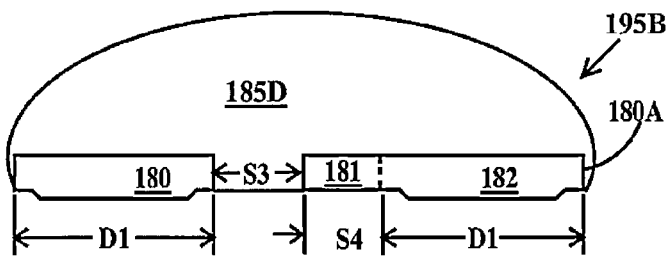
FIG. 7A is a side view through line 7A-7A of the top view of FIG. 7B illustrating the structure of FIGS. 6A and 6B with solder wetting on the pedestal sidewalls.
Figure 7B:
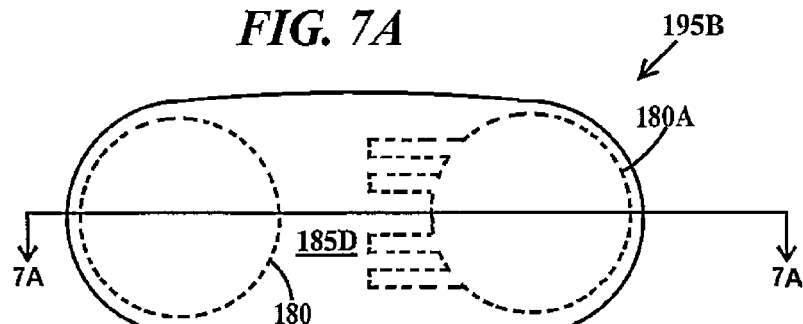

FIG. 7A is a side view through line 7A-7A of the top view of FIG. 7B illustrating the structure of FIGS. 6A and 6B with solder wetting on the pedestal sidewalls. In FIGS. 7A and 7B, solder wetting of the pedestal sidewalls has occurred after the first reflow and because the sidewall wetting and the smaller spacing S2, a single oval shaped solder bump 185D is formed. Solder bump 185D is easily distinguished from the pair of solder bumps 185 and 185D of FIGS. 6B and 6C.

In FIGS. 6A, 6B, 6C, 7A and 7B, pedestals 180 are the same as pedestal 180 of FIG. 1 and pedestals 180A are the same as pedestal 180 except for the addition of comb 181. In FIGS. 6A, 6B, 6C, 7A and 7B no underlying chip structures are illustrated. If the monitor structure 195A is placed in the kerf (see FIG. 9A and discussion infra), at least all the dielectric layers present in FIG. 1 would be present in FIGS. 6A, 6B, 6C, 7A and 7B. Optionally at least chip pad similar to chip pad 140 of FIG. 1 and organic passivation layer 145 would be present. If monitor structure 195A is placed in the empty regions of the wafer (see FIG. 9A and discussion infra), not all the layers present in FIG. 1 would be present in FIGS. 6A, 6B, 6C, 7A and 7B. For example, only certain of the layers would be present. Again, optionally at least chip pad similar to chip pad 140 of FIG. 1 and organic passivation layer 145 would be present.

Solder columns 184 and 184A are part of monitor structure 195B before the first reflow and solder bumps 185, 185C and 185D are part of the monitor structure 195B after the first reflow only in the same sense that the fusible link of a fuse is part of the fuse after the fuse blows.

After the first reflow that forms the solder bumps, monitor structure 195B is inspected at wafer level. If two distinct solder bumps are detected as in FIG. 6C, then the wafer is passed. If a single solder bump is detected as in FIG. 7B, then the wafer is failed.

FIG. 8 is a top view of illustrating a structure for detecting solder wetting of the pedestal sidewall according to an embodiment of the present invention. In FIG. 8, a monitor structure 195C includes a first pair 196 of pedestals 180 spaced apart a distance S5, a second pair 197 of pedestals 180 spaced apart a distance S6, a third pair 198 of pedestals 180 spaced apart a distance S7 and a fourth pair 199 of pedestals 180 spaced apart a distance S8. S1 is greater than S5, S5 is greater than S6, S6 is greater than S7 and S7 is greater than S8. In one example, S5 is equal to about half of S1, S6 is equal to about half of S5, S7 is equal to about half of S6 and S8 is equal to about half of S7. In one example, if S1 is about 100 microns, then S5 is about 50 microns, S6 is about 25 microns, S7 is about 12.5 microns and S8 is about 6.25 microns. This graduation of spacing from pedestal pair 196 to pedestal pad 199 provides more information to base wafer pass/fail decisions on. It would be expected that if a single solder bump is detected by pedestal pair 198, a single solder bump would also be detected by pedestal pair 199. However, detection of a single solder bump at pedestal pair 199 may not result in a fail if two solder bumps are detected by pedestal pairs 196, 197 and 198. In FIG. 8, only the pedestals are illustrated, it should be understood that there are solder columns on the top surfaces of the pedestals with the perimeters of the pedestals and respective solder columns coextensive. Though FIG. 8 is illustrated with pairs of test structures 195A (see FIGS. 4A and 4B) test structures 195B of FIGS. 6B and 6C may be substituted.

Figure 9A:
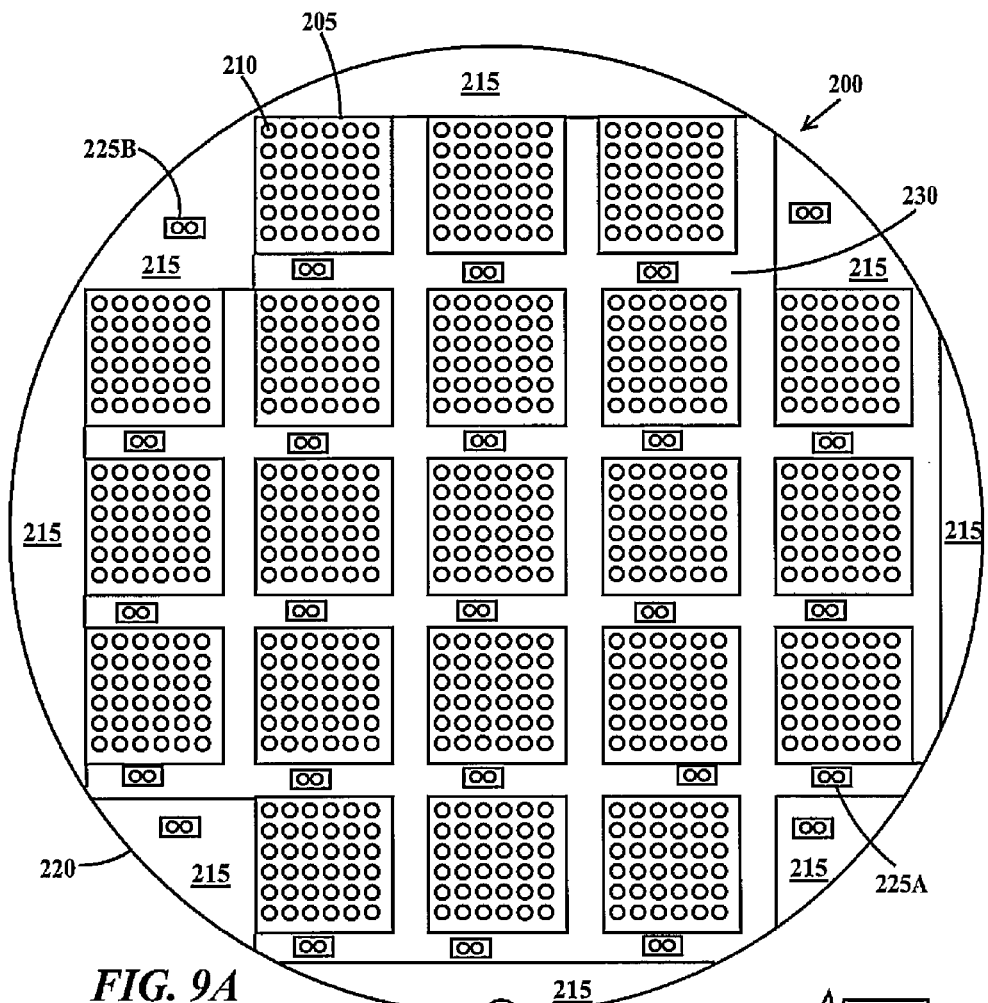
FIG. 9A is a top view of an integrated circuit wafer illustrating placement of sidewall wetting monitors according to embodiments of the present invention.

FIG. 9A is a top view of an integrated circuit wafer illustrating placement of sidewall wetting monitors according to embodiments of the present invention. In FIG. 9A a semiconductor wafer 200 after forming solder bumps and before performing the first reflow is illustrated. Wafer 200 includes an array of integrated circuit chips 205. Each integrated circuit chip includes an array of solder bumps 210. Perimeters of the solder bumps are coextensive with perimeters of the pedestals on which the solder bumps have been plated at this point because the first reflow has not yet been performed. There is an unused region 215 between the array of integrated circuit chips 205 and the perimeter 220 of wafer 200. Between chips 205 is a kerf region 230. Kerf regions 205 do not include functional parts of the chip but include mask alignment and test structures. Formed in regions 215 are one or more monitor structures 225A. Each monitor structures may include one or more of monitor structures 195A (see FIGS. 4A and 4B), 195B (see FIGS. 6B and 6C) or 195C (see FIG. 8). Since kerf regions 230 are included in the photomasks used to fabricate chips 205 the layers and structures under monitor structures 225B may more easily mimic the structures under solder bumps 210. Optionally monitor structures 225B may be placed in unused regions 230, but the layers and structures under monitor structures 225B may be different from those under solder bumps 210.

Figure 9B:
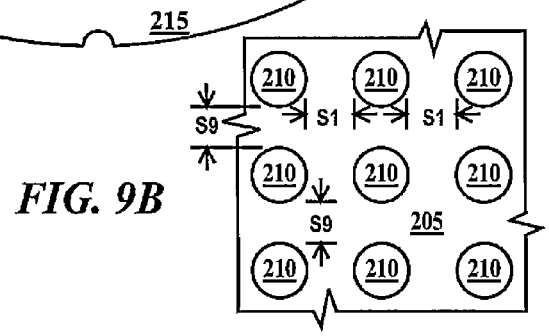
FIG. 9B is a top view of a region of an integrated circuit chip of FIG. 9A illustrating the spacing between pedestal.

FIG. 9B is a top view of a region of an integrated circuit chip of FIG. 9A illustrating the spacing between pedestals. In FIG. 9B, a portion of an integrated circuit chip 205 of FIG. 9A is illustrated. Solder bumps 210 (and their respective pedestals) are spaced a distance S1 apart in a first direction and spaced apart a second distance S9 in a second direction. The first direction is perpendicular to the second direction. The distance S1 has been discussed supra with respect to FIG. 3A so it is clear that the distance S2 discussed supra with respect to FIG. 4A, the distance S3 discussed supra with respect to FIG. 6B and the distances S5, S6, S7 and S8 discussed supra with respect to FIG. 8 are smaller than S1.

Figure 10:
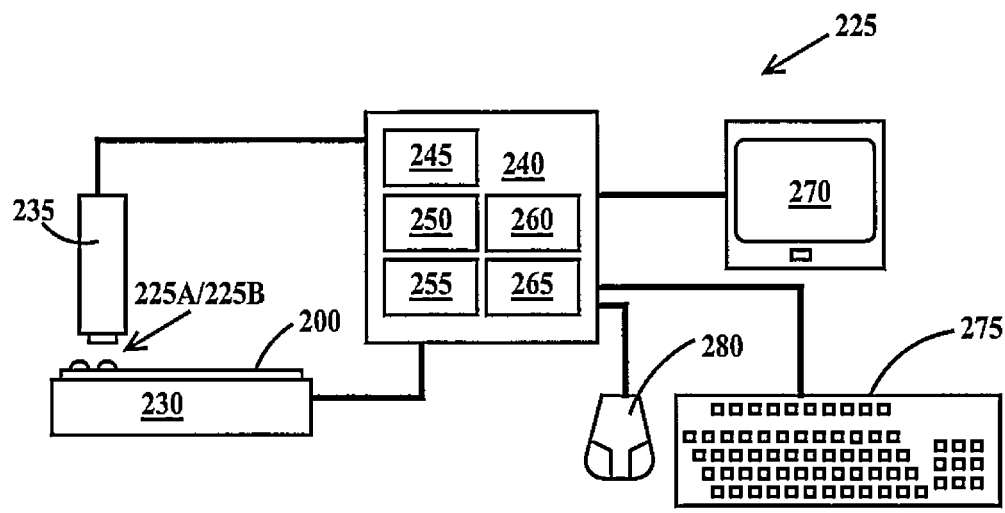
FIG. 10 is a schematic diagram of an apparatus for optically inspecting sidewall wetting monitors according to embodiments of the present invention.

FIG. 10 is a schematic diagram of an apparatus for optically inspecting sidewall wetting monitors according to embodiments of the present invention. In FIG. 10, an optical inspection apparatus 225 includes a XY stage 230, a camera 235, a controller 240 including an optical recognition system 245, a focus controller 250, a scan controller 255, a microprocessor 260 and memory 265, a display unit 270, a keyboard 275 and a mouse 280. A wafer 200 to be inspected is placed on stage 230 and monitor structures 225A and/or 225B are inspected either automatically or manually by a human inspector. A single solder bump instead of two indicates a fail for pedestal sidewall solder wetting.

Figure 11:
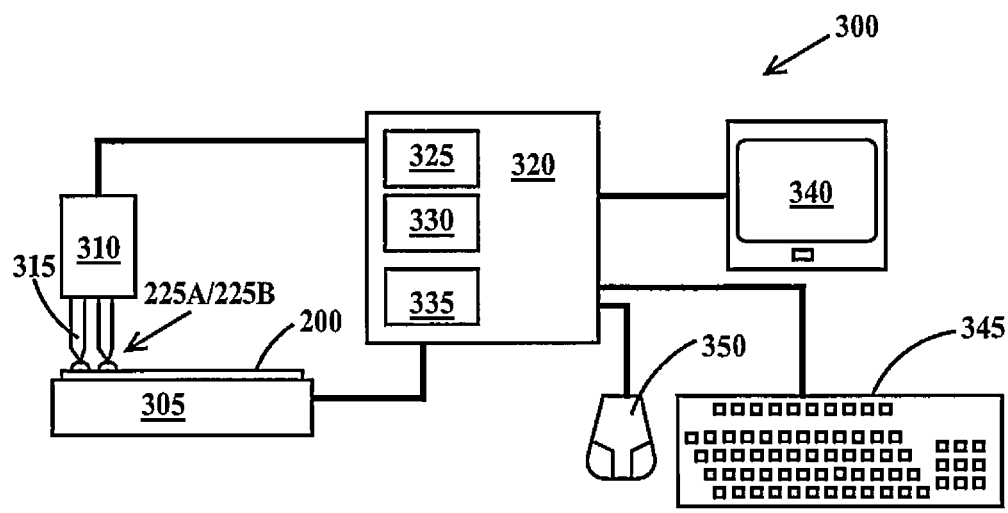
FIG. 11 is a schematic diagram of an apparatus for electrically inspecting sidewall wetting monitors according to embodiments of the present invention.

FIG. 11 is a schematic diagram of an apparatus for electrically inspecting sidewall wetting monitors according to embodiments of the present invention. In FIG. 11, an electrical test apparatus 300 includes a XY stage 305, a probe head 310 having at least a pair of probes 315, a tester 320 including a scan controller 325, a microprocessor 330 and memory 335, a display unit 340, a keyboard 345 and a mouse 350. A wafer 200 to be probed is placed on stage 305 and monitor structures 225A and/or 225B are probed either automatically or manually by a human inspector. A first probe is placed on the first solder bump of the monitor structure 225A and/or 225B and a second probe is placed on the second solder bump of the monitor structure 225A and/or 225B. A short or low resistance between the first and second probes indicates a fail for pedestal sidewall solder wetting.

Thus the embodiments of the present invention provide a structure for and a method of detecting sidewall wetting of the pedestal by the solder bump.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure, comprising:
   a semiconductor wafer having an array of integrated circuit chips, each integrated circuit chip of said array of integrated circuit chips having an array of chip pedestals having respective chip solder columns on top surfaces of said chip pedestals, said pedestals spaced apart a first distance in a first direction and a spaced apart second distance in second direction perpendicular to said first direction; and
   at least one monitor structure disposed in different regions of said semiconductor wafer from said integrated circuit chips, said monitor structure comprising at least a first pedestal and a first solder column on a top surface of said first pedestal and a second pedestal and a second solder column on a top surface of said second pedestal, said first and said second pedestals spaced apart a third distance, said third distance less than said first distance and said second distance.

2. The structure of claim 1, wherein said chip pedestals and said first pedestal and second pedestal are raised above a top surface of an uppermost dielectric layer of said integrated circuit chip and sidewalls of said chip pedestals and said first and second pedestals are exposed.

3. The structure of claim 1, wherein said third distance is selected to facilitate, if said first solder column and said second solder column are heated to the melting point said first and second solder columns, (i) said first and second solder columns merging into a single solder bump if the solder from said first and second solder columns wets the sidewalls of said first and second pedestals and (ii) forming two solder bumps if said solder does not wet the sidewalls of said first and second pedestals.

4. The structure of claim 1, wherein said chip pedestals, said first pedestal and said third pedestal have a same diameter.

5. The structure of claim 1, wherein said chip pedestals, said first pedestal and said third pedestal are comprised of the same layers of the same materials.

6. The structure of claim 1, wherein said first pedestal has a first circular body region and said second pedestal includes an integral comb structure extending from one side of a second circular body region, said comb comprised of at least two parallel fingers extending toward said first pedestal and terminating said third distance from said first pedestal.

7. The structure of claim 1, wherein perimeters of said chip pedestals and perimeters of said chip solder columns are co-extensive, perimeters of said first pedestal and said first solder column are coextensive and perimeters of said second pedestal and said second solder column are coextensive.

8. The structure of claim 1, wherein said monitor structure further includes:
a third pedestal and a third solder column on a top surface of said third pedestal and a fourth pedestal and a fourth solder column on a top surface of said fourth pedestal, said third and said fourth pedestals spaced apart a fourth distance, said fourth distance less than said first distance, said second distance and said third distance.

9. A method, comprising:
forming a semiconductor wafer having an array of integrated circuit chips, each integrated circuit chip of said array of integrated circuit chips having an array of chip pedestals having respective chip solder columns on top surfaces of said chip pedestals, said pedestals spaced apart a first distance in a first direction and a spaced apart second distance in second direction perpendicular to said first direction; and
at least one monitor structure disposed in different regions of said semiconductor wafer from said integrated circuit chips, said monitor structure comprising at least a first pedestal and a first solder column on a top surface of said first pedestal and a second pedestal and a second solder column on a top surface of said second pedestal, said first and said second pedestals spaced apart a third distance, said third distance less than said first distance and said second distance.

10. The method of claim 9, wherein said chip pedestals and said first pedestal and second pedestal are raised above a top surface of an uppermost dielectric layer of said integrated circuit chip and sidewalls of said chip pedestals and said first and second pedestals are exposed.

11. The method of claim 9, wherein said third distance is selected to facilitate, if said first solder column and said second solder column are heated to the melting point said first and second solder columns, (i) said first and second solder columns merging into a single solder bump if the solder from said first and second solder columns wets the sidewalls of said first and second pedestals and (ii) forming two solder bumps if said solder does not wet the sidewalls of said first and second pedestals.

12. The method of claim 9, wherein said chip pedestals, said first pedestal and said third pedestal have a same diameter.

13. The method of claim 9, wherein said chip pedestals, said first pedestal and said third pedestal are comprised of the same layers of the same materials.

14. The method of claim 9, wherein said first pedestal has a first circular body region and said second pedestal includes an integral comb structure extending from one side of a second circular body region, said comb comprised of at least two parallel fingers extending toward said first pedestal and terminating said third distance from said first pedestal.

15. The method of claim 9, wherein perimeters of said chip pedestals and perimeters of said chip solder columns are co-extensive, perimeters of said first pedestal and said first solder column are coextensive and perimeters of said second pedestal and said second solder column are coextensive.

16. The method of claim 9, wherein said monitor structure further includes:
a third pedestal and a third solder column on a top surface of said third pedestal and a fourth pedestal and a fourth solder column on a top surface of said fourth pedestal, said third and said fourth pedestals spaced apart a fourth distance, said fourth distance less than said first distance, said second distance and said third distance.

17. The method of claim 9, further including:
heating said chip solder columns and said first and second solder columns to a temperature at which said chip columns and said first and second columns melt thereby forming chip solder bumps on said chip pedestals and either separate first and second solder bumps on said first and second pedestals or one solder bump formed on both said first and second pedestals; and
optically inspecting said first and second pedestals to determine if there are separate first and second solder bumps on said first and second pedestals or one solder bump formed on both said first and second pedestals.

18. The method of claim 9, further including:
heating said chip solder columns and said first and second solder columns to a temperature at which said chip columns and said first and second columns melt thereby forming chip solder bumps on said chip pedestals and either separate first and second solder bumps on said first and second pedestals or one solder bump formed on both said first and second pedestals; and
electrically probing solder bumps formed on said first and second pedestals to determine if there are separate first and second solder bumps on said first and second pedestals or one solder bump formed on both said first and second pedestals.

19. A structure, comprising:
at least two chip pedestals having top surfaces and respective solder columns on top surfaces thereof, said chip pedestals spaced a first distance apart; and
a first pedestal having a first circular body region and a second pedestal having a circular body region and an integral comb structure extending from one side of said second circular body region, said comb comprised of at least two parallel fingers extending toward said first pedestal and terminating a second distance from said first pedestal, said first distance greater than said second distance.

20. The structure of claim 19, wherein said chip pedestals and said first and second pedestals are raised above a top surface of an uppermost dielectric layer of said integrated circuit chip and sidewalls of said chip pedestals and said first pedestal and second pedestal are exposed and wherein said chip pedestals, said first pedestal and said second pedestal are comprised of the same layers of the same materials.

21. The structure of claim 19, wherein said second distance is selected to facilitate, if said first solder column and said second solder column are heated to the melting point said first and second solder columns, (i) said first and second solder columns merging into a single solder bump if the solder from said first and second solder columns wets the sidewalls of said first and second pedestals and (ii) forming two solder bumps if said solder does not wet the sidewalls of said first and second pedestals.

* * * * *